(12) United States Patent
Davis

(10) Patent No.: US 12,079,035 B2
(45) Date of Patent: *Sep. 3, 2024

(54) PORTABLE COMPUTER MONITOR

(71) Applicant: Kelsey Jane Davis, New York, NY (US)

(72) Inventor: Kelsey Jane Davis, New York, NY (US)

( * ) Notice: Subject to any disclaimer, the term of this patent is extended or adjusted under 35 U.S.C. 154(b) by 103 days.

This patent is subject to a terminal disclaimer.

(21) Appl. No.: 18/057,354

(22) Filed: Nov. 21, 2022

(65) Prior Publication Data

US 2023/0305597 A1    Sep. 28, 2023

Related U.S. Application Data

(63) Continuation of application No. 17/693,079, filed on Mar. 11, 2022, now Pat. No. 11,507,142.

(51) Int. Cl.
*G06F 1/16* (2006.01)
*H05K 5/02* (2006.01)

(52) U.S. Cl.
CPC .......... *G06F 1/1647* (2013.01); *G06F 1/1656* (2013.01); *H05K 5/0243* (2013.01)

(58) Field of Classification Search
CPC ............................. G06F 1/1628; H05K 5/0243
See application file for complete search history.

(56) References Cited

U.S. PATENT DOCUMENTS

| | | |
|---|---|---|
| 5,590,021 A | 12/1996 | Register |
| D378,677 S | 4/1997 | Matsumoto et al. |
| 5,687,939 A | 11/1997 | Moscovitch |
| D449,302 S | 10/2001 | Jung |
| D589,511 S | 3/2009 | Han |
| D600,689 S | 9/2009 | Jen |
| D615,054 S | 5/2010 | Mellingen et al. |
| D634,745 S | 3/2011 | Park et al. |
| D679,707 S | 4/2013 | Aarrestad et al. |

(Continued)

FOREIGN PATENT DOCUMENTS

| | | |
|---|---|---|
| JP | 0683779 | 4/1973 |
| JP | 2010243812 | 10/2010 |
| TW | 192216-0001 | 8/2018 |

OTHER PUBLICATIONS

Portabl website 2018, portable extra monitor for laptop, site visited Feb. 7, 2023, https://www.portabl.com/.

*Primary Examiner* — Mukundbhai G Patel
(74) *Attorney, Agent, or Firm* — Cislo & Thomas, LLP

(57) ABSTRACT

A portable system for carrying a monitor and a computing device inside a case. The case can be made from two shells attached together by a hinge. A monitor can be housed in each shell, the monitors operatively connected to each other. The monitor and any other components in the first shell can be connected to the monitor and any other components in the second shell via cables fed through a conduit connecting the first shell to the second shell. The conduit is on the inside of the case to protect the cables when the case is in the closed configuration. One or both shells can further have an auxiliary door through which a thin component, such as a keyboard, tablet, laptop, and the like can be inserted into the case. One or both shells can be equipped with ports for power, and communicating and networking with other devices.

18 Claims, 6 Drawing Sheets

(56) References Cited

U.S. PATENT DOCUMENTS

| | | |
|---|---|---|
| D708,158 S | 7/2014 | Minyard |
| D771,582 S | 11/2016 | Williams et al. |
| 10,353,427 B1* | 7/2019 | Rabb .................... G06F 1/1628 |
| D929,987 S | 9/2021 | Lin et al. |
| D960,887 S | 8/2022 | Levine |
| 11,507,142 B1 | 11/2022 | Davis |
| 2005/0185916 A1* | 8/2005 | Jost ....................... G06F 1/1628 |
| 2010/0265646 A1 | 10/2010 | Lee et al. |
| 2013/0119210 A1 | 5/2013 | Moscovitch |
| 2014/0240272 A1* | 8/2014 | Huang .................. G06F 1/1647 |
| | | 345/173 |
| 2015/0198831 A1 | 7/2015 | Kim |
| 2020/0065048 A1 | 2/2020 | Partida Meraz |
| 2020/0074915 A1 | 3/2020 | Kamara |
| 2021/0245065 A1* | 8/2021 | Reichert ................ A63F 13/98 |
| 2021/0246065 A1 | 8/2021 | Reichert et al. |

\* cited by examiner

PORTABLE COMPUTER MONITOR

CROSS-REFERENCE TO RELATED APPLICATION

This patent application is a continuation of U.S. patent application Ser. No. 17/693,079, filed Mar. 11, 2022, which application is incorporated in its entirety here by this reference.

TECHNICAL FIELD

The invention of the present application relates to computer monitors, specifically, monitors configured for easy transportation and storage.

BACKGROUND

Laptop computers and tablets allow for computers to be easily transported and set up almost anywhere. Laptops and tablets, however, suffer from the limited screen size. Furthermore, for many users, a single monitor is not sufficient, particularly when multi-tasking with multiple programs running simultaneously. Laptops and tablets can be connected to larger desktop monitors, but the desktop monitors are not easily transportable as they can be large and cumbersome, particularly with their stands. In addition, the screens of monitors are fragile and susceptible to being scratched or damaged.

For the foregoing reasons there is a need for monitors that are conducive for being transported so that users on the go can use their monitors with full-size screens.

SUMMARY

The invention of the present application is directed to a portable computer monitor having a case comprised of two shells for an open configuration, in which the components of the case are accessible and usable, and a closed configuration, in which the components of the case are hidden from view and protected. One or more monitors can be placed inside the case. In the preferred embodiment, each shell houses one monitor. The monitors and other components housed in the shells can be operatively connected to each other via a conduit interconnecting one shell to another. Cables can be routed through the conduit. One or both cases can have an auxiliary door that allows access to the interior of the case without having to open the case. The auxiliary door can be used to store thin devices, such as keyboards, laptops, tablets, and the like.

It is an object of the invention of the present application to provide portable monitors, such as those used with computers, that are easy to deploy and easy to stow away.

It is another object of the invention of the present application to provide portable monitors that can also accommodate other computing components.

It is another object of the invention of the present application to provide portable monitors that can also carry a computer, such as a laptop or tablet.

DETAILED DESCRIPTION OF THE INVENTION

The detailed description set forth below in connection with the appended drawings is intended as a description of presently-preferred embodiments of the inventions in the present application and is not intended to represent the only forms in which the inventions may be constructed or utilized. The description sets forth the functions and the sequence of steps for constructing and operating the inventions in connection with the illustrated embodiments. It is to be understood, however, that the same or equivalent functions and sequences may be accomplished by different embodiments that are also intended to be encompassed within the spirit and scope of the inventions. In addition, the drawings are not intended to show specific embodiments, but rather, are intended to show examples of implementations of the features described in the inventions. As such, features and configurations shown in any one drawing can be implemented in any other embodiment described herein whether such embodiment is shown or not. Although features of the inventions of the present application may be described in the singular, such feature may be present in a plurality, particularly in light of the general bilateral symmetry of the inventions.

Figure 8:
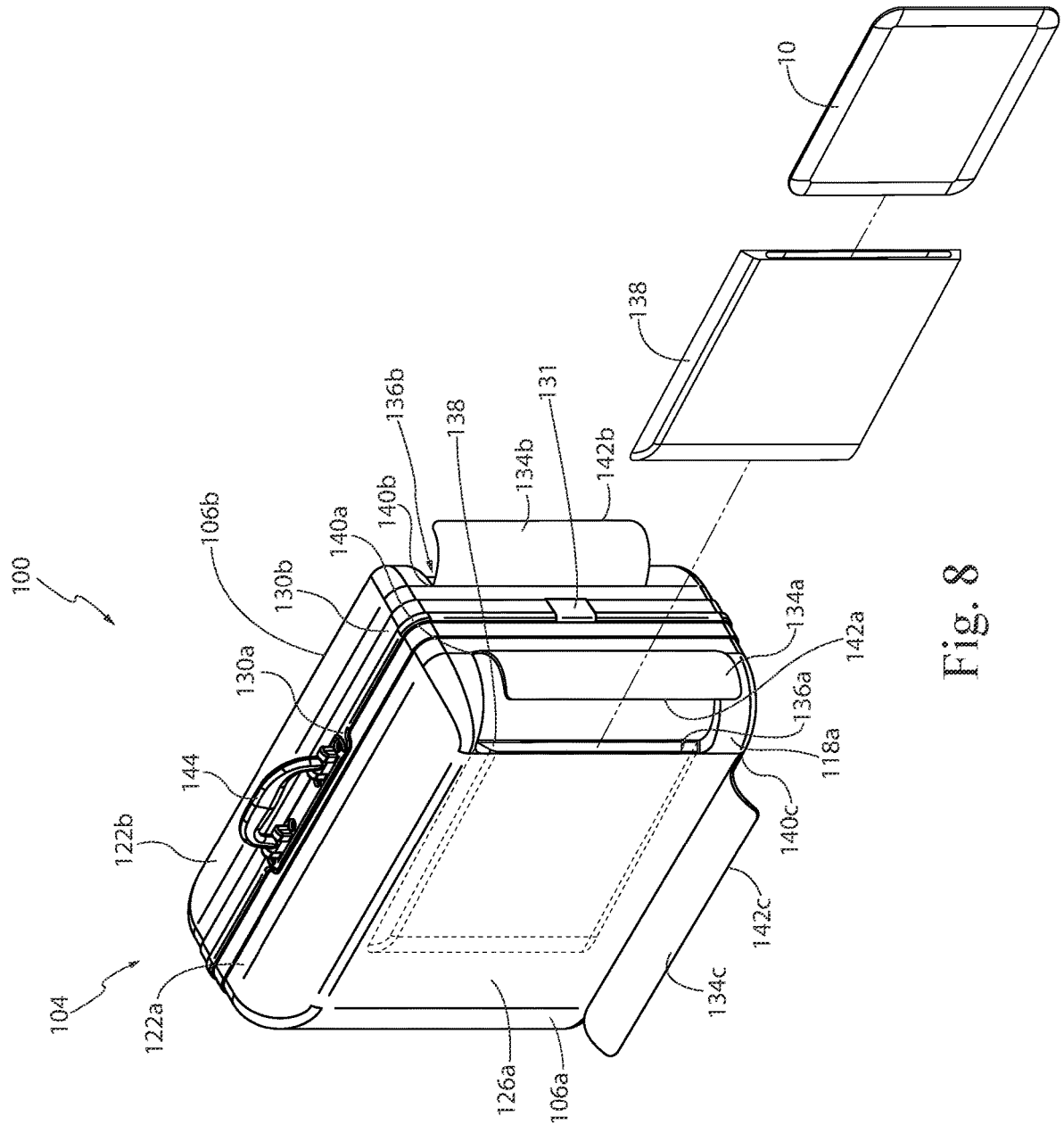
FIG. 8 shows a perspective view of an embodiment of an invention of the present application in the closed configuration with the auxiliary doors open.

The inventions of the present application are directed towards a portable computer monitor 100 in which one or more monitors 102a, 102b are housed inside a case 104 for easy transportation and storage. The portable monitor 100 can have an open configuration in which the monitors 102a, 102b are exposed and usable as shown in FIGS. 1-7, and a closed configuration in which the monitors 102a, 102b are hidden in the case 104 as shown in FIG. 8. For ease of reference, the interior or inside refer to the portion of the case 104 that cannot be seen when the case 104 is in the closed configuration, specifically, the portion of the case 104 that houses the monitors 102a, 102b; and the exterior or outside refer to the portion of the case 104 that is visible when the case 104 is in the closed configuration.

The case 104 can be a briefcase type case having a first shell 106a and a second shell 106b. In the preferred embodiment, each shell 106a, 106b can be generally rectangular in shape to fit monitors that are generally rectangular in shape. Nonetheless, the exterior of the shells 106a, 106b can be any other shape, including circular or oval shapes, so long as the inside of the shells 106a, 106b are sufficiently large to house one or more monitors 102a, 102b. Preferably, the case 104 is made of hard durable material, such as metal (e.g. aluminum), plastic (e.g. polycarbonate, polypropylene, acrylonitrile butadiene styrene, polyethylene terephthalate, etc.), carbon fiber, and the like. Softer, more pliable material can be used, such as polyester, nylon (e.g., regular nylon, ballistic nylon, cordura, etc.), canvas, leather, and the like. For cases 104 made of soft materials, additional framing may be required for mounting the monitors 102a, 102b inside the case 104. Preferably, the case 104 is waterproof when in the closed configuration to keep the monitors 102a, 102b dry in wet weather or if the case is inadvertently dropped into water.

Preferably, each shell 106a, 106b has a lateral side 108a, 108b, a medial side 110a, 110b opposite the lateral side 108a, 108b, a top side 112a, 112b adjacent to the lateral side 108a, 108b and the medial side 110a, 110b, and a bottom side 114a, 114b opposite the top side 112a, 112b and adjacent to the lateral side 108a, 108b and the medial side 110a, 110b. Each side can have a sidewall. As such, each shell 106a, 106b can have a lateral-side wall 118a, 118b along their respective lateral sides 108a, 108b. Each shell 106a, 106b can have a medial-side wall 120a, 120b along their respective medial sides 110a, 110b. Each shell 106a, 106b can have a top-side wall 122a, 122b along their respective top sides 112a, 112b. Each shell 106a, 106b can have a bottom-side wall 124a, 124b along their respective bottom sides 114a, 114b. Each shell 106a, 106b can have a base 126a, 126b interconnecting the respective lateral-side wall 118a, 118b, medial-side wall 120a, 120b, top-side wall 122a, 122b, and bottom-side wall 124a, 124b to define a main compartment 128a, 128b within each shell 106a, 106b. Each shell 106a, 106b can have a free edge 130a, 130b opposite its respective base 126a, 126b that defines an opening into the main compartment 128a, 128b.

The width W of each shell 106a, 106b is defined by the distance from the lateral-side wall 118a, 118b to the medial-side wall 120a, 120b. The height H of each shell 106a, 106b is defined by the distance from the top-side wall 122a, 122b to the bottom-side wall 124a, 124b. The depth D of each shell 106a, 106b is defined by the distance from base 126a, 126b to the free edge 130a, 130b of the shell 106a, 106b.

The main compartment 128a, 128b is sufficiently large to house a monitor 102a, 102b. As such, the width W of each shell 106a, 106b can range from about 10 inches to about 28 inches. Preferably, the width W can range from about 12 inches to about 25 inches. More preferably, the width W can range from about 14 inches to about 22 inches. The height H of each shell 106a, 106b can range from about 7 inches to about 22 inches. Preferably, the height H can range from about 10 inches to about 20 inches. More preferably, the height H can range from about 12 inches to about 18 inches. The depth D of each shell 106a, 106b can range from about 0.5 inch to about 10 inches. Preferably, the depth D can range from about 1 inch to about 8 inches. More preferably, the depth D can range from about 2 inches to about 6 inches. Within these dimension, the case 104 can house two standard monitors having an 8 inch diagonal up to a 35 inch diagonal, with or without monitor stands. Preferably, the case 104 can house monitors ranging from a 12 inch diagonal to a 32 inch diagonal. More preferably, the case 104 can house monitors ranging from a 15 inch diagonal to a 27 inch diagonal. Monitors with a 24 inch diagonal to a 27 inch diagonal are very common and can be used with the invention of the present application.

In some embodiments, the main compartments 128a, 128b can be lined with protective material 129, such as foam, rubber, silicone, fabric, mesh and the like to protect the monitors 102a, 102b should the case 104 be subject to impact, such as dropping, bumping, shaking, and like. In addition, the case 104 can be configured to create a watertight seal when the case 104 is in the closed configuration using, using for examples, seals, gaskets, and other similar sealing material.

Preferably, the two shells 106a, 106b can be attached to each other at their respective medial sides 110a, 110b by a hinge 132 to allow the case 104 to have an open configuration in which the free edges 130a, 130b are separated and apart from each other to expose the contents of the case 104 (FIGS. 1-7), and a closed configuration in which the free edges 130a, 130b are adjacent to and/or abutted against each other to hide the contents of the case 104 (FIG. 8). One or more closures 131 placed adjacent and/or along the free edges 130a, 130b can be used to keep the case 104 in the closed configuration, such as latches, magnets, zippers, and other closures typical of briefcases, suitcases, backpacks, and the like.

Attaching the shells 106a, 106b at their respective medial sides 110a, 110b allows the case 104 to open like a book and stand upright with the monitors 102a, 102b side-by-side adjacent to each other. As a result, a limited number of components are required to allow the case to stand upright. In addition, the hinge 132 does not experience much strain because each shell 106a, 106b provides independent support for their respective monitors 102a, 102b. Nonetheless, the shells 106a, 106b can also be configured to be attached to the top and bottom sides so that one monitor 102a is above the second monitor 102b. In such embodiments, additional components may be required to keep the monitors 102a, 102b in an open and stable configuration.

In some embodiments, one or both shells 106a, 106 be can have an auxiliary door 134a, 134b. The auxiliary door 134a, 134b leads to a sub-compartment 136a, 136b of the case 104. Preferably, the sub-compartment 136a, 136b is located adjacent to the respective monitor 102a, 102b. More preferably, the sub-compartment 136a, 136 is located behind the respective monitor 102a, 102b. As such, the sub-compartment 136a, 136b can be established between a monitor 102a, 102b and the base 126a, 126b of the shell 106a, 106b. The sub-compartment 136a, 136b is configured to hold accessories and supplemental equipment and products. For example, the sub-compartment 136a, 136b can be configured to hold devices 10, such as keyboards, tablets, laptops, pointing devices (e.g. mouse, track pad, track ball, joystick, pen, and the like), external drives, and the like, or other accessories, such as paper, notepads, notebooks, writing implements, and the like. In some embodiments, a cover 138 can be provided as an additional layer of protection for devices 10 such as tablets, notebooks, and keyboards. As such, the cover 138 can be configured to fit inside the sub-compartment 136a, 136b, and made of foam, rubber, silicone, or other material to provide cushioning, and protect against vibration or impact. The cover 138 can be in the form of a sleeve, a folder, or any other type of barrier between the device 10 inserted therein and anything such device 10 may contact during storage.

The auxiliary door 134a, 134b can be placed along the lateral side 108a, 108b, the medial side 110a, 110b, the top side 112a, 112b, or the bottom side 114a, 114b, and can be configured to open and close by a swinging action, a sliding, and the like. In some embodiments, at least a portion of the base 126a, 126b may be movably connected to at least one of the side walls by a hinge, tracks, rails, and the like, and thereby function as the auxiliary door.

In some embodiments, the auxiliary door can function as a stand when in the open configuration. For example, auxiliary door 134c can be positioned on the bottom side 114a, 114b with a door hinge 140c connected to or near the base 126a, 126b. A free edge 142c of the auxiliary door 134c can be adjacent the free edge 130a, 130b of the shell 106a, 106b when the auxiliary door 134c is in its closed configuration. In its open configuration, the free edge 142c of the auxiliary door 134c can be positioned behind the base 126a, 126b (away from the free edge 130a, 130b of the shell 106a, 106b) with the free edge 142a, 142b facing downward to rest against a table top. The range of the door hinge 140c can be limited so that the top side 112a, 112b of the shell 106a, 106b can be tilted towards the back side at a desired angle with the free edge 142c abutting against the table top to prevent the case 104 from tipping over towards the back side. A similar result can be accomplished with the auxiliary doors 134a, 134b on the lateral-side walls 118a, 118b with the free edges adjacent to the door hinge 140a, 140b on the bottom side 114a, 114b resting on the table top. In such embodiments, preferably, the auxiliary doors 134a, 134b open away from their respective free edges 130a, 130b.

In some embodiments, desired positioning of the monitors 102a, 102b can also be accomplished using existing monitor/tv mounts with tilting, swiveling, rotating, articulating, and/or extending features. For example, each shell 106a, 106b can have a dividing wall that creates the sub-compartment 136a, 136b with the base 126a, 126b. The dividing wall 141 can be configured to support standard monitory/tv mounts.

In some embodiments, the bottom-side wall 124a, 124b can be flat so as to maintain an upright configuration when the case 104 is opened or closed. In some embodiments, the bottom-side wall 124a, 124b can have feet (not shown) for better balance. The feet can be adjustable in height to adjust the angle of the monitors 102a, 102b. The feet can be fixedly or removably mounted on the bottom side 114a, 114b of the case 104, or the feet can be hidden in the case and extend out from the bottom side 114a, 114b of the case (i.e. telescoping, threaded screw, sliding, ratcheting, etc.) when needed.

In some embodiments, the case 104 can comprise rollers (not shown) so that the case 104 can be rolled on the ground as an alternative to carrying the portable computer monitor 100. The rollers can be like those on suitcases, carts, backpacks, and the like. The case 104 can further comprise a handle 144 along the top side 112a, 112b of the case 104. A handle 144 can be placed on each shell 106a, 106b or on one of the shells 106a, 106b. In some embodiments, the handle 144 may be fixed to the case 104. In embodiments in which the case 104 further comprises rollers, the handle 144 can be a telescoping handle that can extend as typical with luggage so as to allow a user to roll the portable computer monitor 100.

In some embodiments, the exterior of the case 104 can comprise one or more ports 146. The ports 146 can be electrical ports, communications ports, networking ports, auxiliary ports, and the like to provide power to the monitors 102a, 102b, or allow the monitors to connect to the Internet or other devices.

Turning to the inside of the case 104, the main compartment 128a, 128b is sufficiently large to house a monitor 102a, 102b and, optionally, a monitor stand 148a, 148b. In the preferred embodiment, the main compartment 128a, 128b is configured such that the monitor 102a, 102b extends all the way across the main compartment 128a, 128b from the lateral-side wall 118a, 118b to the medial-side wall 120a, 120b so as to maximize use of the space in the lateral direction. In some embodiments, the monitor 102a, 102b extends from the top-side wall 122a, 122b all the way to the bottom-side wall 124a, 124b.

In embodiments with a monitor stand 148a, 148b, the monitor 102a, 102b may not extend all the way to the bottom-side wall 124a, 124b. Due to the monitor stand 148a, 148b, a gap 150a, 150b is created between the bottom of the monitor 102a, 102b and the bottom-side wall 124a, 124b. This gap 150a, 150b can be used to house other components related to the monitor 102a, 102b. For example, the gap 150a, 150b can be used to house components such as the central processing unit, cables 12, power packs, batteries, networking hubs 14, outlets 16, ports, cameras 18, speakers, microphones, pointing devices (e.g. mouse, track pad, track ball, joystick, pen, and the like), external hard drives 20, sensors, and many other computer accessories that may be used with a computer or monitor. Preferably, the gap 150a, 150b is located under the monitor to provide a heavier base when the other components are installed; however, the gap 150a, 150b can be positioned anywhere else adjacent to the respective monitors 102a, 102b, such as above the monitor 102a, 102b, lateral to the monitor 102a, 102b, or medial to the monitor 102a, 102b, particularly if there is no monitor stand.

Figure 1:
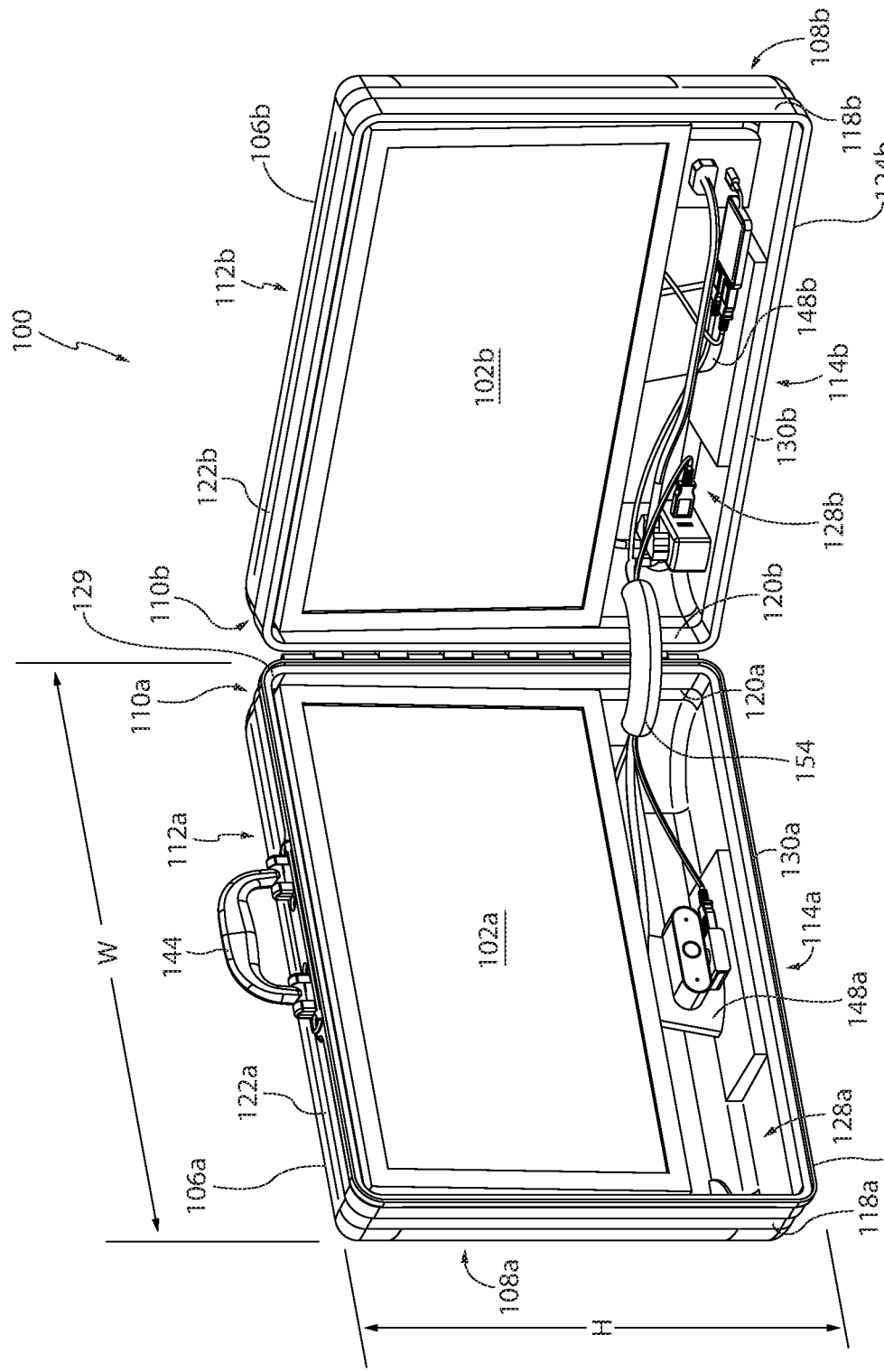
FIG. 1 shows a front perspective view of an embodiment of an invention of the present application in the open configuration.
Figure 2:
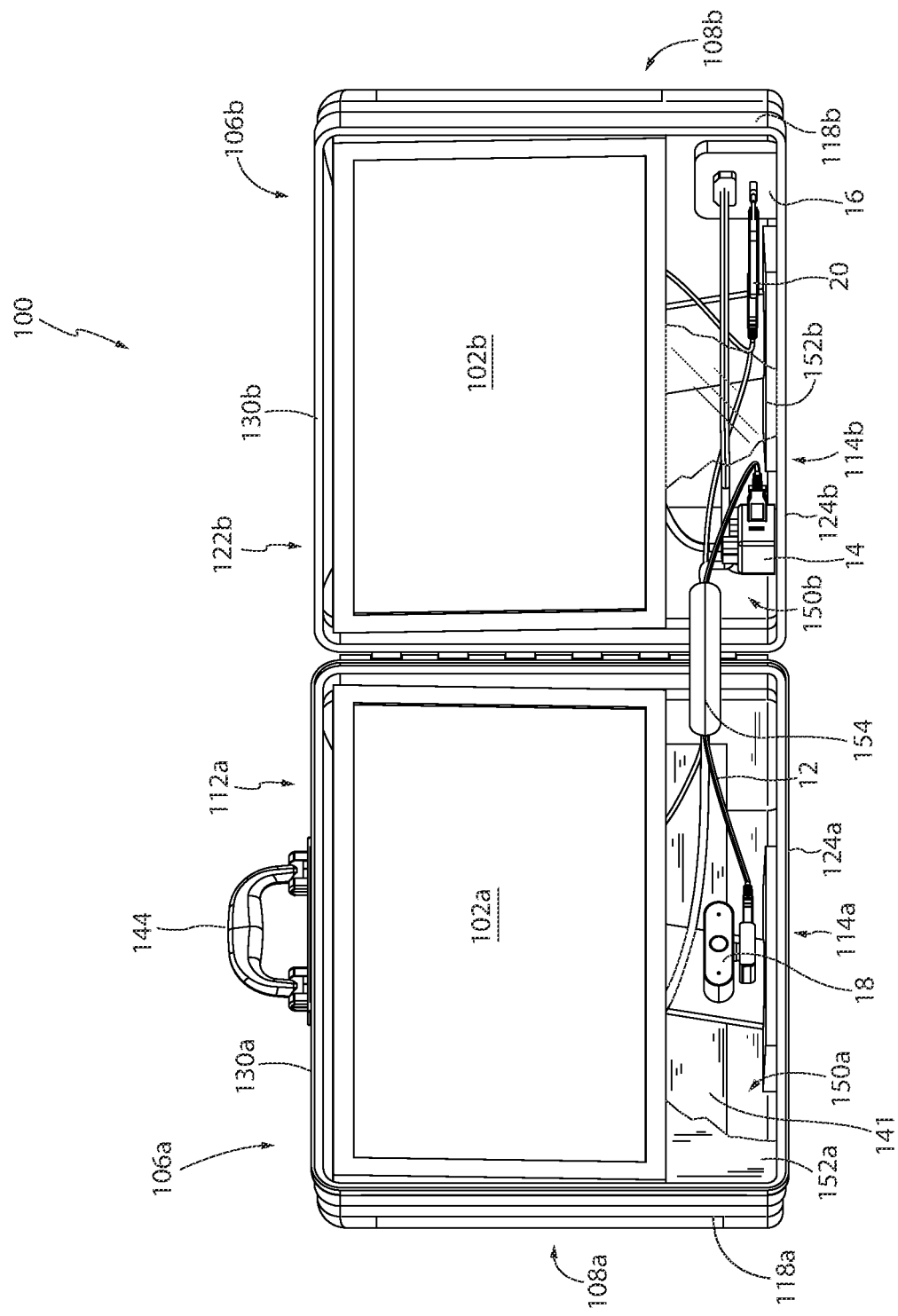
FIG. 2 shows a front elevation view of an embodiment of an invention of the present application in the open configuration.
Figure 3:
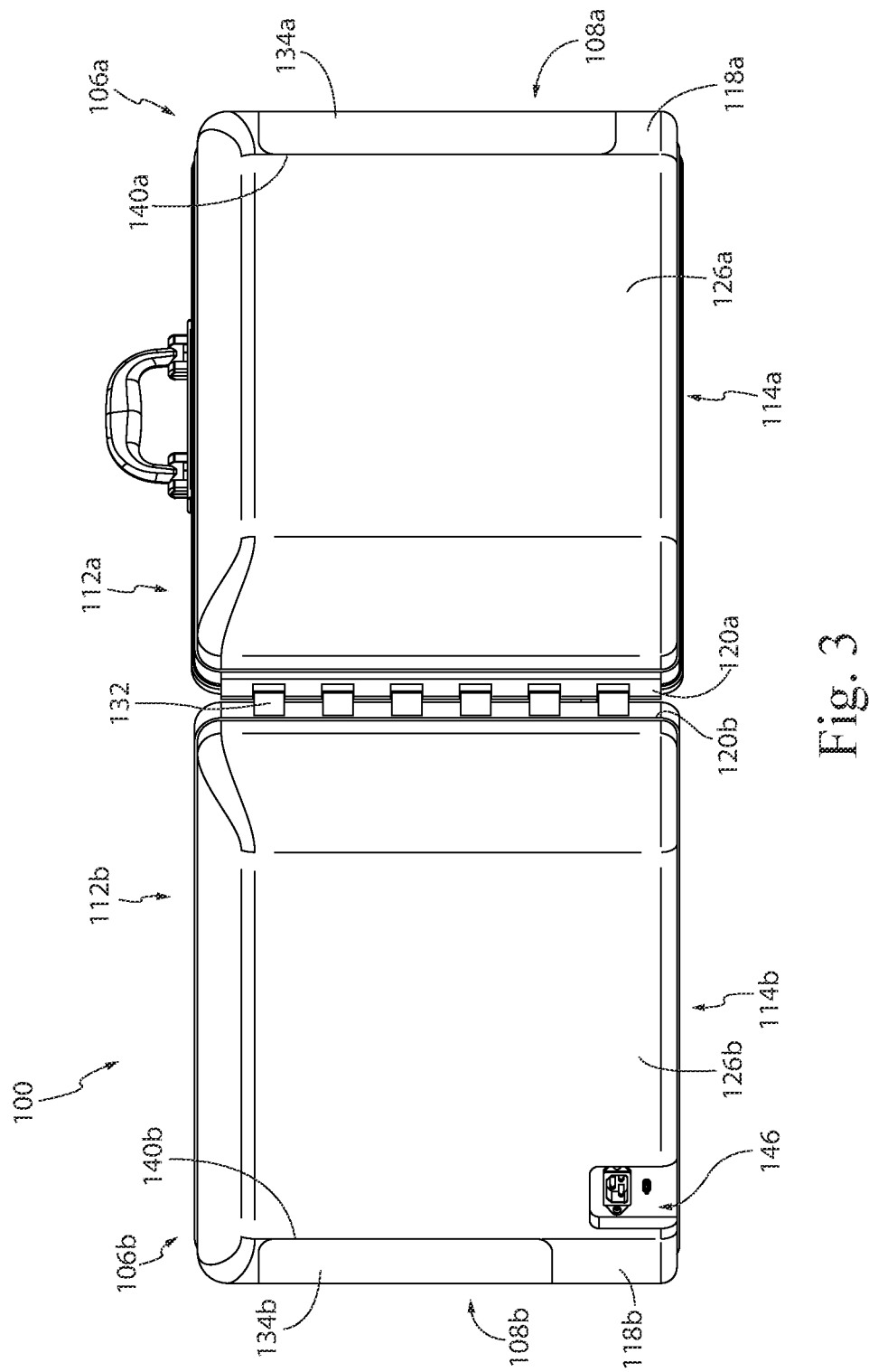
FIG. 3 shows a back elevation view of an embodiment of an invention of the present application in the open configuration.
Figure 4:
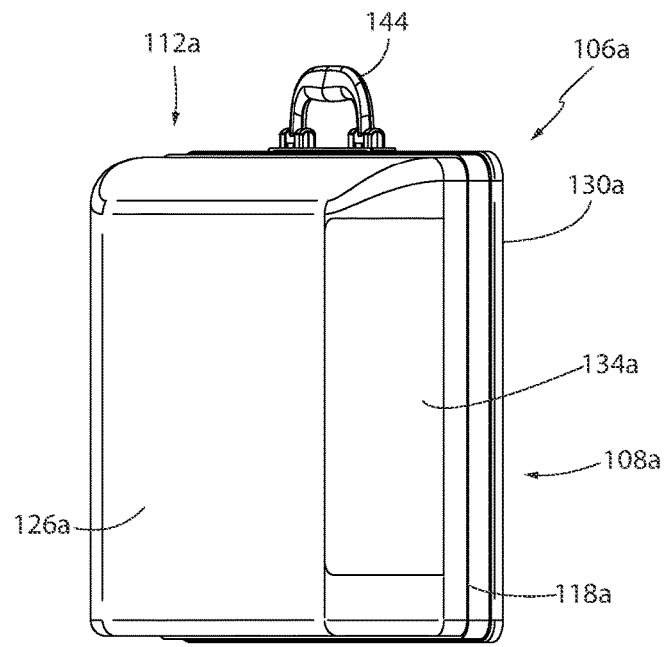
FIG. 4 shows a first side elevation view of an embodiment of an invention of the present application in the open configuration.
Figure 5:
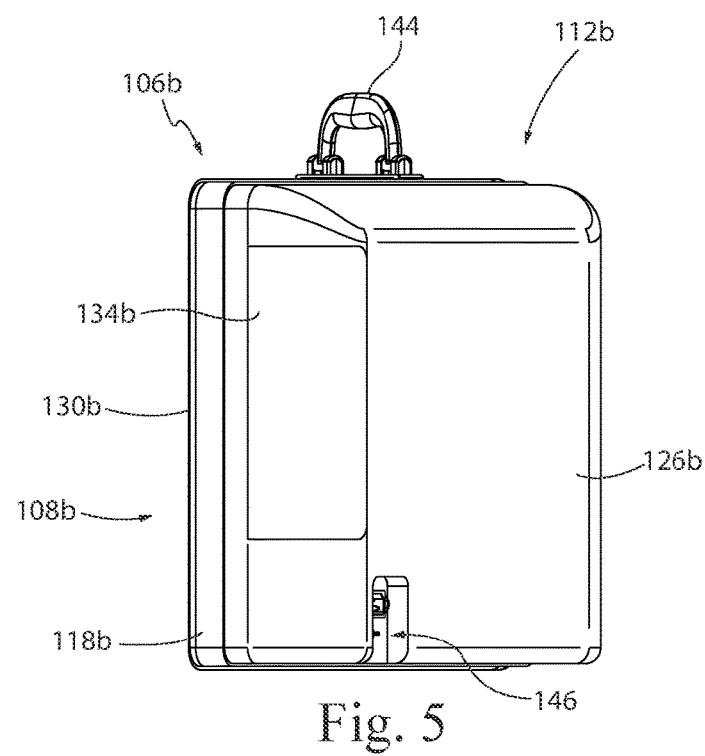
FIG. 5 shows a second side elevation view of an embodiment of an invention of the present application in the open configuration.
Figure 6:
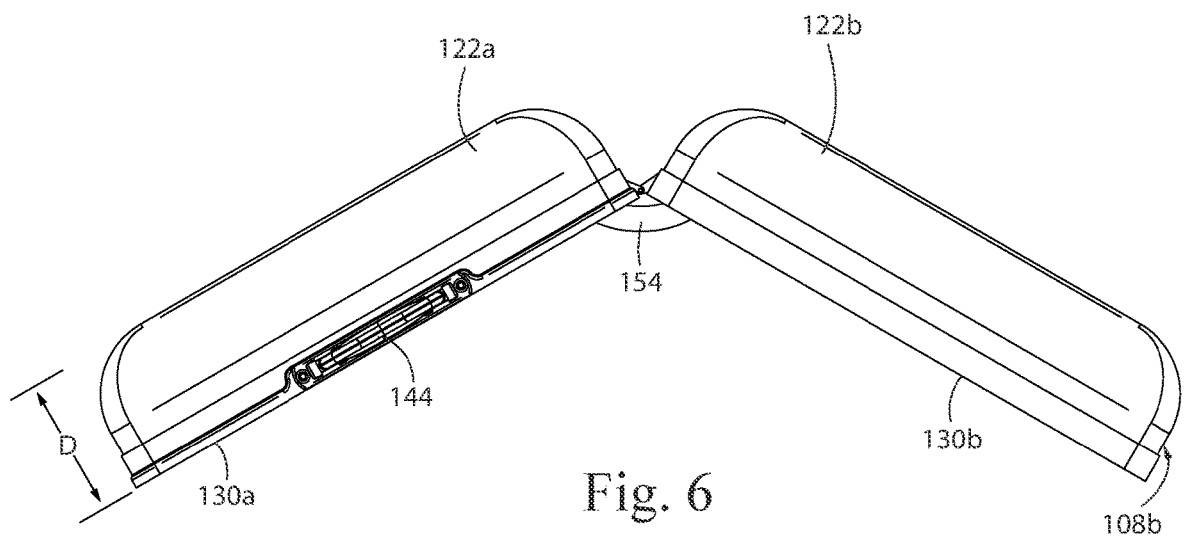
FIG. 6 shows a top plan view of an embodiment of an invention of the present application in the open configuration.
Figure 7:
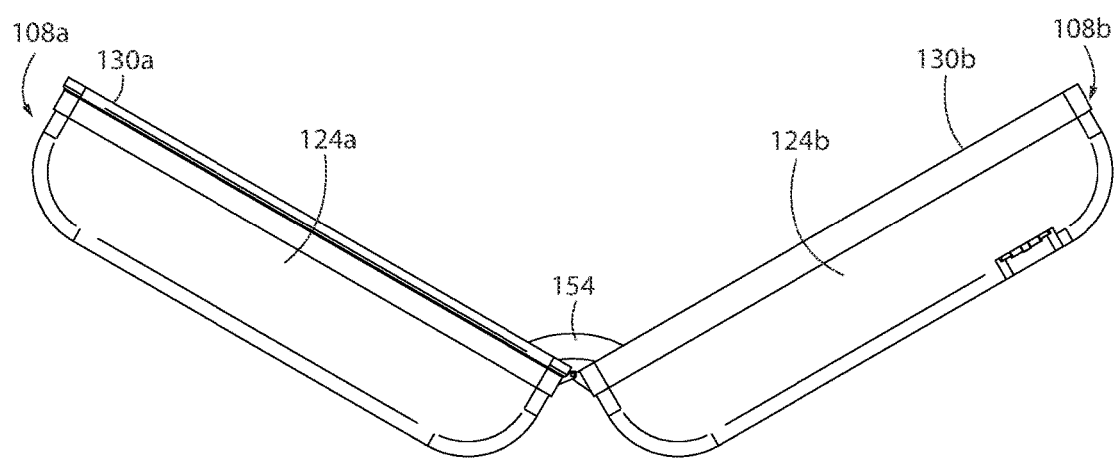
FIG. 7 shows a bottom plan view of an embodiment of an invention of the present application in the open configuration.

In some embodiments, the gap 150a, 150b can be covered with a shield 152a, 152b to hide these components for a cleaner look. FIG. 2 shows an embodiment with a shield 152a, 152b. In FIG. 2, the shield 152a, 152 is shown as a cutaway to show the components behind the shield 152a, 152b. The shield 152a, 152b be can be openable or removable so as to access the components residing in the gap 150a, 150b. In some embodiments, the shield 152a, 152b can be opaque, reflective, transparent, translucent, or any combination thereof.

In embodiments with monitor stands 148a, 148b, the viewing angle of the monitors 102a, 102b can be adjusted based on the connection of the monitors 102a, 102b to their respective monitor stands 148a, 148b. Thus, the viewing angle of the monitors 102a, 102b can be changed by adjusting the angle on the monitor stand 148a, 148b instead of adjusting the angle of the case 104. Therefore, the stand 148a, 148b can be an adjustable stand.

In order for one or more components in one shell 106a to communicate with one or more components in the second shell 106b, a conduit 154 can connect the first shell 106a to the second shell 106b. The conduit 154 provides a channel though which cables can pass from the first shell 106a to the second shell 106b even when the case 104 is in a closed configuration. As such, the conduit 154 is preferably on the inside of the case 104, but can also be on the exterior side of the case 104. By way of example only, the conduit 154 can be used to connect the first monitor 102a to the second monitor 102b, power cords to the first and second monitors 102a, 102b, and numerous other components to the first and/or second monitors 102a, 102b, including, but not limited to, central processing units, speakers, microphones, cameras, pointing devices, keyboards, hard drives, and the like. To promote a cleaner, more aesthetically pleasing appearance, the conduit 154 can connect the two shells 106a, 106b together through their respective shields 152a, 152b. As such, each shield 152a, 152b can have a hole on their respective medial sides 110a, 110b to reduce the length of travel of cables from one shell 106a to the other shell 106b.

In some embodiments, the monitors 102a, 102b can be standard computer monitors used with typical desktop computers. Minor modifications may be required to fit into the case 104 and connect with each other. As such, the monitors 102a, 102b can have the standard ports for connecting to other computer related devices, including, but not limited to, USB ports, HDMI ports, microphone ports, video ports, audio ports, and the like. In some embodiments, an external central processing unit is required to connect to the monitors 102a, 102b. As such, the monitors 102a, 102b should be configured to connect with an external computer, laptop, tablet, smart phone, and the like. In some embodiments, the monitors 102a, 102b can be all-in-one computers in which the central processing unit, memory, hard drive, and the like are housed within the form factor of the monitor 102a, 102b. As such, ports normally found on a computing device (desktop computer, laptop computer, tablet, smart phone, and the like) can be found on the monitor 102a, 102b directly.

The foregoing description of the preferred embodiments of the inventions in the present application has been presented for the purposes of illustration and description. It is not intended to be exhaustive or to limit the inventions to the precise form disclosed. Many modifications and variations are possible in light of the above teaching. It is intended that the scope of the inventions not be limited by this detailed description, but by the claims and the equivalents to the claims appended hereto.

What is claimed is:

1. A portable system, comprising:
    a) a monitor;
    b) a case having a first shell and a second shell, the first shell defining a main compartment to house the monitor;
    c) an auxiliary door leading into a sub-compartment of the case between the case and the monitor;
    d) a hinge attaching the first shell to the second shell, wherein the case has an open configuration in which the monitor is exposed and usable, and a closed configuration in which the monitor is hidden;
    e) a conduit connecting one or more components of the first shell to one or more components of the second shell; and
    f) an adjustable stand operatively connected to the monitor.

2. The system of claim 1, further comprising a cover insertable into the sub-compartment.

3. The system of claim 1, further comprising at least one port on the case.

4. The system of claim 1, further comprising a gap defined in between the case and the monitor.

5. The system of claim 1, further comprising a shield to hide the conduit.

6. The system of claim 1, wherein the auxiliary door is a stand when in an open configuration.

7. The system of claim 1, further comprising a dividing wall between a base and the monitor to define the sub-compartment between the base and the dividing wall.

8. The system of claim 1, further comprising a second monitor housed in the second shell.

9. The system of claim 8, further comprising a second gap defined in between the second shell and the second monitor.

10. The system of claim 9, further comprising a second auxiliary door leading into a second sub-compartment of the case between the second shell and the second monitor.

11. A method of manufacturing a portable computer monitor, comprising:
    a) providing a monitor with an adjustable stand;
    b) providing a first shell;
    c) providing a second shell;
    d) attaching the first shell to the second shell with a hinge to create a case defining a main compartment to house the monitor, the case having an open configuration in which the monitor is exposed and usable, and a closed configuration in which the monitor is hidden;
    e) creating an auxiliary door in the first shell leading into a sub-compartment of the case between the case and the monitor; and
    f) connecting one or more components of the first shell with one or more components of the second shell with a conduit.

12. The method of claim 11, further comprising inserting a monitor into the first shell.

13. The method of claim 12, further comprising creating a dividing wall between a base of the first case and the monitor to define a sub-compartment between the base and the dividing wall that is accessible via the auxiliary door.

14. The method of claim 13, further comprising inserting a second monitor into the second shell.

15. The method of claim 14, further comprising creating a second auxiliary door in the second shell.

16. The method of claim 15, further comprising creating a second dividing wall between a second base of the second case and the second monitor to define a second sub-compartment between the second base and the second dividing wall that is accessible via the second auxiliary door.

17. The method of claim 11, further comprising inserting cables from the first shell through the conduit to the second shell.

18. The method of claim 17, further comprising providing a shield to cover the cables in the first shell.

* * * * *